United States Patent [19]
Yeh et al.

[11] Patent Number: 6,147,529
[45] Date of Patent: Nov. 14, 2000

[54] VOLTAGE SENSING CIRCUIT

[75] Inventors: Jun-Lin Yeh, Hsinchu Hsien; Chien-Chung Chen, Taipei, both of Taiwan

[73] Assignee: Winbond Electronics Corp., Hsinchu, Taiwan

[21] Appl. No.: 09/207,472

[22] Filed: Dec. 8, 1998

[30] Foreign Application Priority Data

Jul. 8, 1998 [TW] Taiwan .................................. 87111078

[51] Int. Cl.⁷ ..................................................... H03K 5/22
[52] U.S. Cl. ................................ 327/143; 327/80; 327/77
[58] Field of Search ..................................... 327/143, 198, 327/77, 78, 79, 80, 81; 365/226, 182

[56] References Cited

U.S. PATENT DOCUMENTS 5,051,958   9/1991   Arakawa .................................. 365/228
5,070,481  12/1991   Haubner et al. ........................ 365/228

*Primary Examiner*—Tuan T. Lam
*Assistant Examiner*—Linh Nguyen
*Attorney, Agent, or Firm*—Ladas & Parry

[57] ABSTRACT

A voltage sensing circuit consists of a sensing node, a transistor of a first conductivity type, a diode-like device, a first reference voltage source, a transistor of a second conductivity type, and a second reference voltage source. The transistor of a first conductivity type is configured with one source/drain receiving an input voltage signal and another source/drain connected to the sensing node. The diode-like device receives the input voltage signal and, accordingly, generates a voltage-dropped signal. The first reference voltage source is connected to a gate of the transistor of the first conductivity type. The transistor of a second conductivity type is configured with one source/drain connected to the sensing node and a gate receiving the voltage-dropped signal. The second reference voltage source is connected to another source/drain of the transistor of the second conductivity type.

12 Claims, 3 Drawing Sheets

6,147,529

VOLTAGE SENSING CIRCUIT

BACKGROUND OF THE INVENTION

1. Field of the Invention

The present invention relates to semiconductor integrated circuitry. More particularly, the present invention relates to a voltage sensing circuit to sense the voltage level of an input voltage signal for integrated circuitry.

2. Description of the Related Art

Usually, voltage-sensing circuits are utilized to sense power up and power down operations in the application of integrated circuitry applications, and, accordingly, enable other circuits to perform the corresponding actions if required. In the power up mode, the voltage sensing circuit receives an input voltage signal, generating an enable output signal when the input voltage signal has exceeded a predetermined threshold level. Before that, when the input voltage signal is below the predetermined threshold level, the voltage sensing circuit generates a disable signal to disable core portions of the integrated circuit so as to prevent uncertain functioning due to either voltage level or system noise. In the power down mode, the voltage sensing circuit generates the disable output signal when the input power voltage falls below the predetermined threshold level, thereby assuring that certain core portions of the circuit are disabled when the power supply goes below the predetermined threshold level and preventing uncertain functioning due to voltage level or system noise.

However, conventional voltage sensing circuits have typically consumed too much power during operation. Such high power consumption is disadvantageous for application in low power consumption products such as notebook computers, personal digital assistants, etc. Therefore, U.S. Pat. No. 5,181,187 discloses a low power voltage sensing circuit as shown in FIG. 1. The voltage sensing circuit of FIG. 1 comprises two PMOS transistors 10 and 13, two reference voltages 11 and 15, a voltage drop circuit 12 and an NMOS transistor 14.

In FIG. 1, the PMOS 10 is configured with one source/drain receiving an input voltage signal $V_{CC}$, another source/drain connected to a sensing node 17 at which a sensing voltage $V_{SEN}$ is generated, and a gate connected to the reference voltage 11. The voltage drop circuit 12 receives the input voltage signal $V_{CC}$ and generates a voltage signal $V_1$ that is lower in voltage than the input voltage signal $V_{CC}$. The PMOS transistor 13 is configured with one source/drain receiving the voltage signal $V_1$, another source/drain connected to the gate of the NMOS transistor 14, and its gate connected to the first reference voltage 11. The NMOS transistor 14 has one source/drain region connected to the sensing node 17, and another source/drain connected to the second reference voltage 15.

Referring to FIG. 1, an embodiment of U.S. Pat. No. 5,181,187 is exemplified in which the first reference voltage 11 and the second reference voltage 15 are simply the ground potentials, the voltage drop circuit 12 being implemented by means of PMOS transistor 16 having one source/drain receiving said input voltage signal $V_{CC}$ and another source/drain tied to its gate.

Accordingly, the voltage sensing circuit of FIG. 1 can produce low current conduction and thus lower power consumption by adjusting the channel width of the PMOS transistor 10 to be greater than the channel width of the NMOS transistor 14. However, at least four MOS transistors are required for the conventional voltage sensing circuit.

SUMMARY OF THE INVENTION

Therefore, it is an object of the present invention to provide a voltage sensing circuit that can be implemented by three transistors so as to further decrease power consumption and required layout area thereof.

The present invention achieves the above-indicated object by providing a voltage sensing circuit consisting of: a sensing node, a transistor of a first conductivity type, a diode-like device, a first reference voltage source, a transistor of a second conductivity type, and a second reference voltage source. The transistor of a first conductivity type is configured with one source/drain receiving an input voltage signal and another source/drain connected to the sensing node. The diode-like device receives the input voltage signal and, accordingly, generates a voltage-dropped signal. The first reference voltage source is connected to a gate of the transistor of the first conductivity type. The transistor of a second conductivity type is configured with one source/drain connected to the sensing node and a gate receiving the voltage-dropped signal. The second reference voltage source is connected to another source/drain of the transistor of the second conductivity type.

Accordingly, the voltage sensing circuit according to the present invention can be implemented with only three MOS transistors, thereby further conserving power consumption and decreasing the required layout area thereof.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Figure 2:
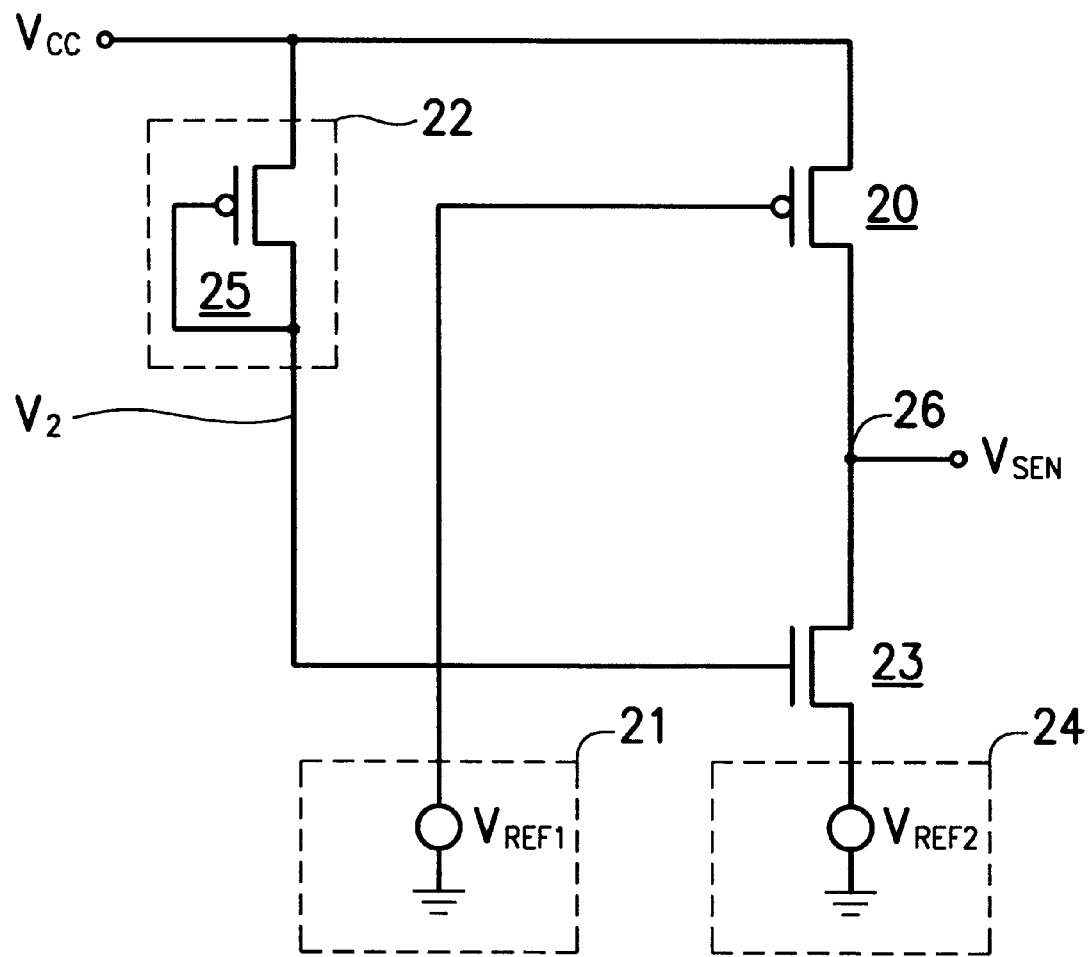
FIG. 2 schematically depicts the circuit diagram of a voltage sensing circuit in accordance with one embodiment of the present invention, FIG. 3 schematically depicts the circuit diagram of a voltage sensing circuit in accordance with one preferred embodiment of the present invention.

Referring to FIG. 2, the circuit diagram of a voltage sensing circuit in accordance with one embodiment of the present invention is schematically depicted. As shown in FIG. 2, the voltage sensing circuit according to one embodiment of the present invention comprises: a PMOS transistor 20, a first reference voltage source 21, a diode-like device 22, a NMOS transistor 23 and a second reference voltage source 24.

The PMOS transistor 20 is configured with one source/drain receiving an input voltage signal $V_{CC}$, another source/drain connected to a sensing node 26 at which a sensing voltage $V_{SEN}$ is generated, and a gate connected to the reference voltage source 21. The diode-like device 22 receives the input voltage signal $V_{CC}$ and generates a voltage-dropped signal $V_2$ which is lower in voltage than the input voltage signal $V_{CC}$. The NMOS transistor 23 has one source/drain region connected to the sensing node 26, another source/drain connected to the second reference voltage source 24, and its gate connected to the diode-like device 22. In other words, the gate of the NMOS transistor 23 is controlled by the voltage-dropped signal $V_2$.

Usually, the first reference voltage source 21 and the second reference voltage source 24 provide a logic-low voltage level to the gate of the PMOS transistor 20 and the source of the NMOS transistor 23, respectively. Therefore, according to one preferred embodiment of the present invention shown in FIG. 3, both of the first reference voltage source 21 and the second reference voltage source 24 are ground potential. The diode-like device 22 is used to decrease the voltage level of the input voltage signal $V_{CC}$. Preferably, at least one PMOS transistor 25 is configured with one source/drain receiving the input voltage signal $V_{CC}$, and with another source/drain and its gate connected together. Although only one PMOS transistor 25 is exemplified to constitute the diode-like device 22, a plurality of PMOS transistors 25 all connected in series is also feasible.

Figure 3:
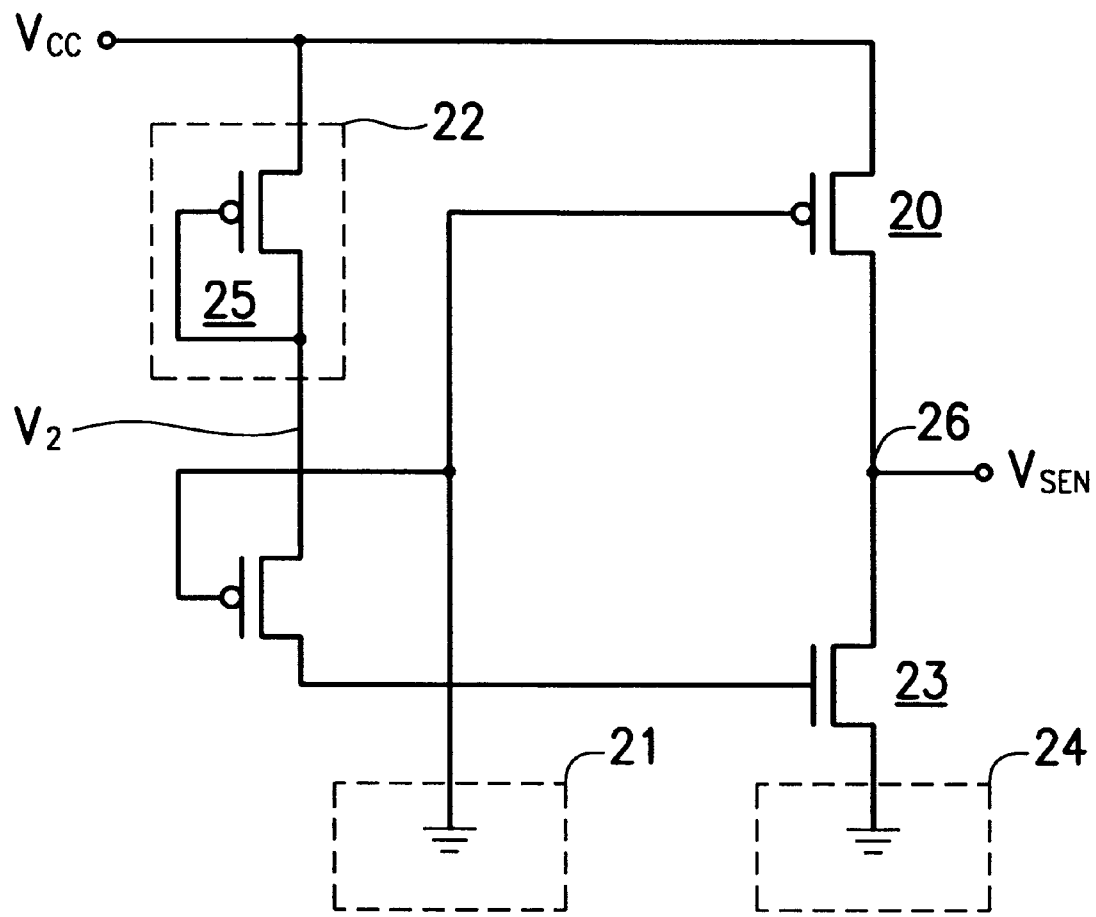

The operation of the voltage sensing circuit will be explained with the reference voltage sources 21 and 24 all being ground potential and the diode-like device 22 being the PMOS transistor 25 as shown in FIG. 3.

In the power up operation, when the input voltage signal $V_{CC}$ begins to increase, the PMOS transistor 20 is kept off until the input voltage signal $V_{CC}$ exceeds the threshold voltage of the PMOS transistor 20. Thus, during the time period when the input voltage signal $V_{CC}$ is between zero and is below the threshold voltage of the PMOS transistor 20, the sensing voltage $V_{SEN}$ at the sensing node 26 would remain at ground potential. In addition, the voltage-dropped signal $V_2$ is always at a voltage level less the input voltage signal $V_{CC}$ by the threshold voltage of the PMOS transistor 25, that is, $V_2=V_{CC}-|V_{thp}|$. Therefore, the NMOS transistor 23 would also be off. Thereafter, when the input voltage signal $V_{CC}$ exceeds the threshold voltage of the PMOS transistor 20, the PMOS transistor 20 would be turned on and then cause the sensing node 26 to charge up and approach the present voltage level of the input voltage signal $V_{CC}$. With the input voltage signal $V_{CC}$ slightly above the threshold voltage of the PMOS transistor 20, the NMOS transistor 23 would still be turned off.

When the input voltage signal $V_{CC}$ exceeds the threshold voltage of the PMOS transistor 25, the voltage-dropped signal $V_2$ would be at or above ground potential. The NMOS transistor 23 is kept off until the voltage-dropped signal $V_2$ is provided with positive potential large enough to turn on the NMOS transistor 23. As soon as the voltage-dropped signal $V_2$ is increased above the threshold voltage of the NMOS transistor 23, the NMOS transistor 23 would be turned on. However, in order to substantially maintain the voltage at the sensing node 26 or the sensing voltage $V_{SEN}$ at $V_{CC}$, the respective aspect ratio (channel width/channel length) of the PMOS transistor 20 and the NMOS transistor 23 can be adjusted so that the turn-on resistance of the NMOS transistor 23 is much greater than that of the PMOS transistor 20. Moreover, such a means can reduce the DC current conducted through the PMOS transistor 20 and the NMOS transistor 23, thereby conserving power consumption.

Once the sensing node 26 reaches the maximum input voltage signal $V_{CC}$, a driver circuit (not shown in the drawing) can be used to generate an enable signal.

In the power down operation, as long as the input voltage signal $V_{CC}$ is greater than the threshold voltage of the PMOS transistor 20, the voltage at the sensing node 26 remains high. However, as soon as the input voltage signal $V_{CC}$ drops below the threshold voltage of the PMOS transistor 20, the PMOS transistor 20 would be turned off However, the NMOS transistor 23 would remain conducting. Thus, the sensing voltage $V_{SEN}$ at the sensing node 26 would be pulled lower by the conducting action of the NMOS transistor 23.

In addition, as the input voltage signal $V_{CC}$ continues to drop below the threshold of the PMOS transistor 25, the voltage-dropped signal $V_2$ is isolated from the input voltage signal $V_{CC}$. Since the voltage-dropped signal $V_2$ is still a positive potential, it would continue to turn on the NMOS transistor 23, causing it to pull down further the sensing voltage $V_{SEN}$ at the sensing node 26 and speed up the discharge of the sensing node 26 to ground potential. Therefore, a driver circuit (not shown in the drawing) can be used to generate a disable signal.

Figure 1:
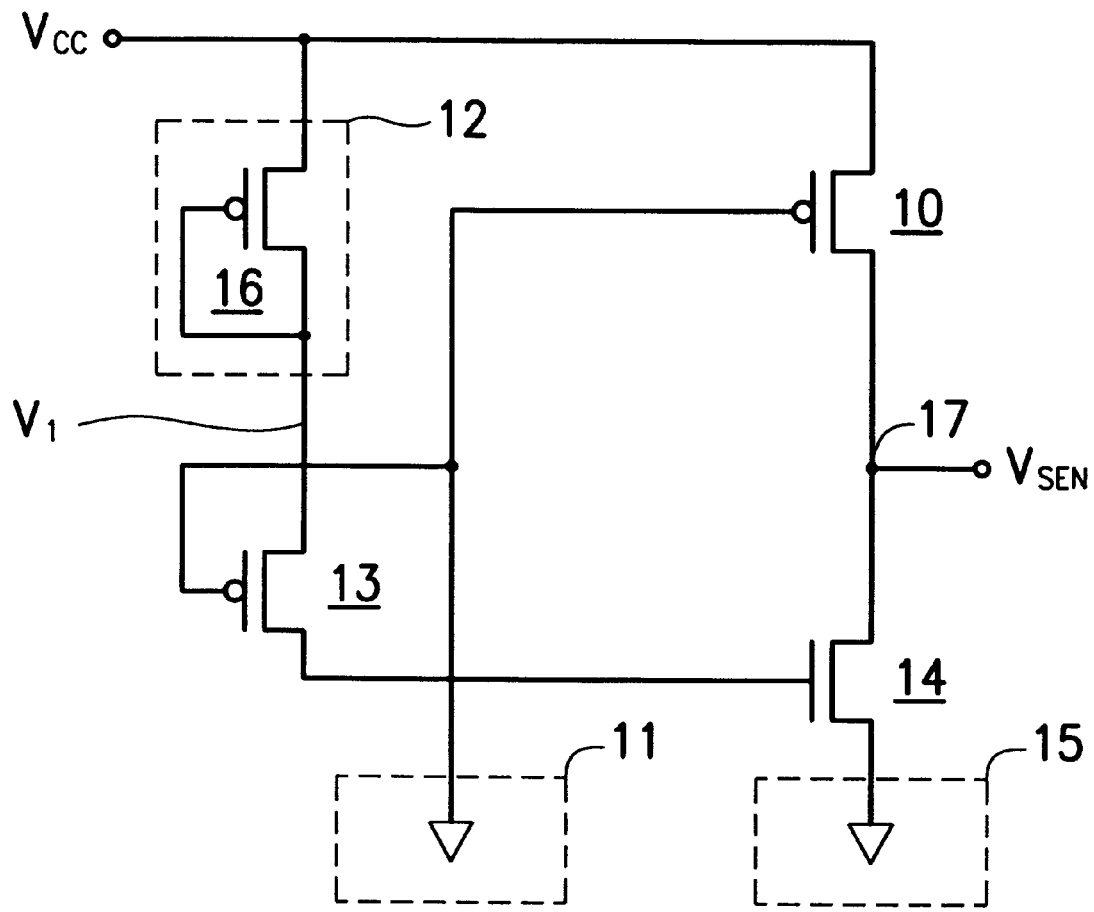
FIG. 1 schematically depicts the circuit diagram of the conventional voltage sensing circuit.

As compared to the conventional voltage sensing circuit shown in FIG. 1, the voltage sensing circuit in accordance with the present invention can remove the current-limiting PMOS transistor 13 and make use of the PMOS transistor 25 to limit current as well as drop voltage. Subsequently, by appropriately adjusting the aspect ratio of the PMOS transistor 25 to increase its turn-on resistance, the input voltage signal $V_{CC}$ would not charge the voltage-dropped signal $V_2$ too quickly, thus preventing the uncertain functioning due to the noise.

In conclusion, the voltage sensing circuit according to the present invention can be implemented with only three MOS transistors, thereby further conserving power consumption and decreasing the required layout area thereof While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A voltage sensing circuit, consisting of:
   a sensing node;
   a transistor of a first conductivity type having one source/drain receiving an input voltage signal and another source/drain connected to said sensing node;
   a diode-like device receiving said input voltage signal and generating a voltage-dropped signal;
   a first reference voltage source connected to a gate of said transistor of the first conductivity type;
   a transistor of a second conductivity type having one source/drain connected to said sensing node and a gate receiving said voltage-dropped signal; and
   a second reference voltage source connected to another source/drain of said transistor of the second conductivity type.

2. The voltage sensing circuit as claimed in claim 1, wherein said input voltage signal is provided with positive potential.

3. The voltage sensing circuit as claimed in claim 2, wherein said transistor of the first conductivity type is a first PMOS transistor.

4. The voltage sensing circuit as claimed in claim 3, wherein said transistor of the second conductivity type is an NMOS transistor.

5. The voltage sensing circuit as claimed in claim 2, wherein said diode-like device is a second PMOS transistor.

6. The voltage sensing circuit as claimed in claim 5, wherein said second PMOS transistor is configured with one source/drain receiving said input voltage signal, and another source/drain and its gate connected together to output said voltage-dropped signal.

7. The voltage sensing circuit as claimed in claim 1, wherein said first reference voltage source is provided with ground potential.

8. The voltage sensing circuit as claimed in claim 1, wherein said second reference voltage source is provided with ground potential.

9. A voltage sensing circuit, consisting of:

a sensing node;

a first PMOS transistor having one source/drain receiving an input voltage signal and another source/drain connected to said sensing node;

a second PMOS transistor having one source/drain receiving said input voltage signal, and another source/drain and its gate connected together to generate a voltage-dropped signal;

a first reference voltage source connected to a gate of said first PMOS transistor;

an NMOS transistor having one source/drain connected to said sensing node and a gate receiving said voltage-dropped signal; and a second reference voltage source connected to another source/drain of said NMOS transistor.

10. The voltage sensing circuit as claimed in claim 9, wherein said input voltage signal is provided with positive potential.

11. The voltage sensing circuit as claimed in claim 9, wherein said first reference voltage source is provided with ground potential.

12. The voltage sensing circuit as claimed in claim 9, wherein said second reference voltage source is provided with ground potential.

* * * * *